(12) United States Patent
Tu et al.

(10) Patent No.: US 8,614,131 B2
(45) Date of Patent: Dec. 24, 2013

(54) SELF-ALIGNED STATIC RANDOM ACCESS MEMORY (SRAM) ON METAL GATE

(75) Inventors: An-Chun Tu, Taipei (TW); Chen-Ming Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 515 days.

(21) Appl. No.: 12/364,701

(22) Filed: Feb. 3, 2009

(65) Prior Publication Data

US 2010/0197141 A1    Aug. 5, 2010

(51) Int. Cl.
*H01L 21/336* (2006.01)
(52) U.S. Cl.
USPC ..... 438/299; 438/183; 438/597; 257/E21.237
(58) Field of Classification Search
USPC ................................................ 438/183, 299
See application file for complete search history.

(56) References Cited

U.S. PATENT DOCUMENTS

| | | | |
|---|---|---|---|
| 5,795,827 A | 8/1998 | Liaw et al. | |
| 5,843,815 A | 12/1998 | Liaw | |
| 5,998,249 A | 12/1999 | Liaw et al. | |
| 6,613,621 B2 * | 9/2003 | Uh et al. | 438/183 |

* cited by examiner

*Primary Examiner* — Leonard Chang
(74) *Attorney, Agent, or Firm* — Haynes and Boone, LLP

(57) ABSTRACT

A method for fabricating an integrated circuit providing an enlarged contact process window while reducing device size is disclosed. The method comprises providing a substrate including a first region and a second region, the first and second regions having one or more gate structures including a dummy gate layer; removing the dummy gate layer from at least one of the one or more gate structures in the first and second regions to form one or more trenches in the first and second regions; filling the one or more trenches in the first and second regions with a conductive layer; selectively etching back the conductive layer of the one or more gate structures in the second region of the substrate; forming a protective layer over the etched back conductive layer of the one or more gate structures in the second region; and forming one or more contact openings in the first and second regions.

20 Claims, 12 Drawing Sheets

SELF-ALIGNED STATIC RANDOM ACCESS MEMORY (SRAM) ON METAL GATE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down has also significantly decreased the space separating contact openings (or windows) from adjacent devices of ICs. Contact openings provide contact between various devices and features of the integrated circuit. Due to the scaled down devices and decreased space separation between devices, it has been observed that conventional processing provides a smaller than desirable contact process window, which leads to restrictive processing and design issues. For example, the smaller contact process window results in design rules requiring a minimum spacing between the contact openings and device features (e.g., gate structures), which provides a smaller than desirable margin of contact/gate structure overlay. Further, if the minimum spacing between the contact openings and such device features varies, poor device performance results, such as contact/gate structure short and contact open issues.

Accordingly, what is needed is a method for making a semiconductor device that addresses the above stated issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
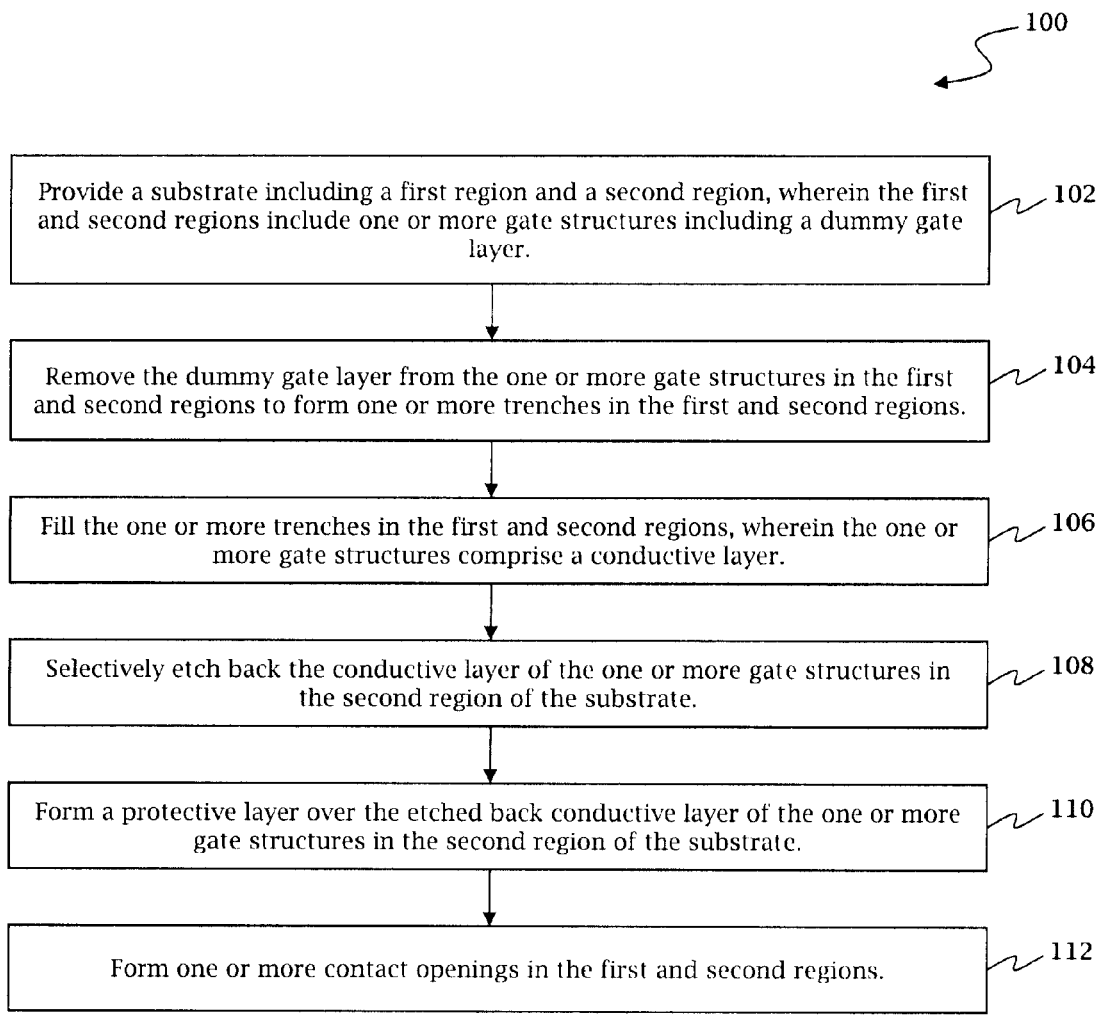
FIG. 1 is a flow chart of a method for fabricating a semiconductor device according to aspects of the present embodiments.

The present disclosure relates generally to methods for manufacturing semiconductor devices, and more particularly, to a method for manufacturing a semiconductor device that enlarges a contact module process window while reducing the size of the semiconductor device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1, 2A-2H, 3, and 4A-4L, methods 100, 300 and semiconductor devices 200, 400 are collectively described below. It is understood that additional steps can be provided before, during, and after the methods 100, 300, and some of the steps described below can be replaced or eliminated, for additional embodiments of the methods. It is further understood that additional features can be added in the semiconductor devices 200, 400, and some of the features described below can be replaced or eliminated, for additional embodiments of the semiconductor devices 200, 400. The present embodiment of methods 100, 300 and semiconductor devices 200, 400 enlarges contact process windows while reducing significantly the size of the semiconductor devices 200, 400.

Figure 2A:
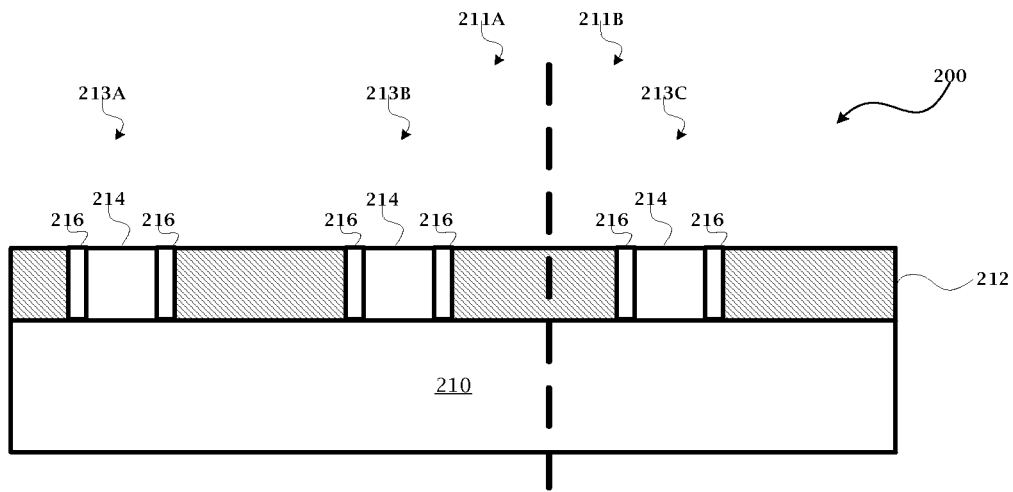
FIGS. 2A-2H are various cross-sectional views of embodiments of a semiconductor device during various fabrication stages according to the method of FIG. 1.

FIG. 1 is a flow chart of one embodiment of the method 100 for making the semiconductor device 200. FIGS. 2A-2H are various cross-sectional views of the semiconductor device 200 according to one embodiment, in portion or entirety, during various fabrication stages of the method 100. Referring to FIGS. 1 and 2A, the method 100 begins at step 102 wherein a substrate 210 including a first region 211A and a second region 211B is provided. It is understood that the substrate 210 may include a plurality of first and second regions 211A, 211B.

In the present embodiment, the substrate 210 is a semiconductor substrate. The substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator (SOI) or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In some embodiments, the semiconductor substrate 210 may comprise glass.

A dielectric layer 212 is disposed over the substrate 210, such as an interlayer (or inter-level) dielectric (ILD) layer. The dielectric layer 212 may be any suitable dielectric material including TEOS oxide, silicon oxide, silicon nitride, silicon oxynitride, hafnium oxide, zirconium oxide, titanium oxide, aluminum oxide, hafnium dioxide-alumina ($HfO_2$—$Al_2O_3$) alloy, PSG, BPSG, other suitable dielectric materials, and/or combinations thereof. In some embodiments, the dielectric layer 212 may comprise a low-k dielectric material, such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper porous polymeric materials, and/or combinations thereof. The dielectric layer 212 may be formed by any suitable process including by chemical vapor deposition (CVD), high density plasma CVD, spin-on, sputtering, spin-on coating, and/or other suitable methods. The dielectric layer 212 may further include a multilayer structure comprising multiple dielectric materials. Further, the dielectric layer 212 may be formed at any suitable thickness. It is understood that additional layers, such as interfacial layers, capping layers, barrier layers, and/or buffer layers, may be formed overlying and/or underlying the dielectric layer 212.

Further, in the present embodiment, disposed over the substrate 210, the first region 211A includes at least one gate structure 213A, 213B comprising a dummy gate layer 214 and spacers 216, and the second region 211B includes at least one gate structure 213C comprising a dummy gate layer 214 and spacers 216. It is understood that the semiconductor device 200 may further comprise additional features known in the art. For example, the semiconductor device 200 may further comprise isolation regions (e.g., shallow trench isolation (STI) and/or local oxidation of silicon (LOCOS)), lightly doped source/drain regions (LDD regions), source/drain (S/D) regions, and/or silicide regions.

The gate structures 213A, 213B, 213C may be formed by any suitable process. For example, the gate structures 213A, 213B, 213C may be formed by conventional deposition, photolithography patterning, and etching processes, and/or combinations thereof. The deposition processes may include chemical vapor deposition (CVD), physical vapor deposition (PVD), atomic layer deposition (ALD), sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the at least one gate structures may be formed simultaneously, utilizing the same processing steps and processing materials; independently of one another, utilizing varying processing steps and processing materials; or using a combination of simultaneous and independent processing steps and processing materials.

The dummy gate layers 214 may comprise a multilayer structure comprising multiple dielectric materials. The dummy gate layers 214 may comprise a layer including a high-k dielectric material, which may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, other suitable high-k dielectric materials, and/or combinations thereof. The dummy gate layers 214 may comprise a layer including a dielectric material, such as silicon-containing materials including polycrystalline silicon, silicon oxide, silicon nitride, silicon oxynitride, and silicon carbide; germanium-containing materials; hafnium oxide, zirconium oxide, titanium oxide, aluminum oxide, hafnium dioxide-alumina ($HfO_2$—$Al_2O_3$) alloy, other suitable dielectric materials, and/or combinations thereof. In some embodiments, the dummy gate layers 214 may comprise a layer of silicon dioxide and a layer of high-k dielectric material. Further, the dummy gate layers 214 may be doped polycrystalline silicon with the same or different doping. It is understood that additional layers may be included in the dummy gate layers 214, such as interfacial layers, capping layers, barrier layers, and/or buffer layers. In the present embodiment, the dummy gate layers 214 comprise polysilicon.

The spacers 216, which may be positioned on each side of the dummy gate layers 214, may comprise a dielectric material, such as silicon nitride, silicon oxide, silicon carbide, silicon oxynitride, other suitable materials, and/or combinations thereof. In the present embodiment, the spacers 216 comprise silicon nitride. The spacers 216 may be formed by any suitable process. The spacers 216 may further include gate liner layers. In some embodiments, the spacers 216 may comprise a multilayer structure. In some embodiments, the spacers 216 may be omitted partially or entirely.

Figure 2B:
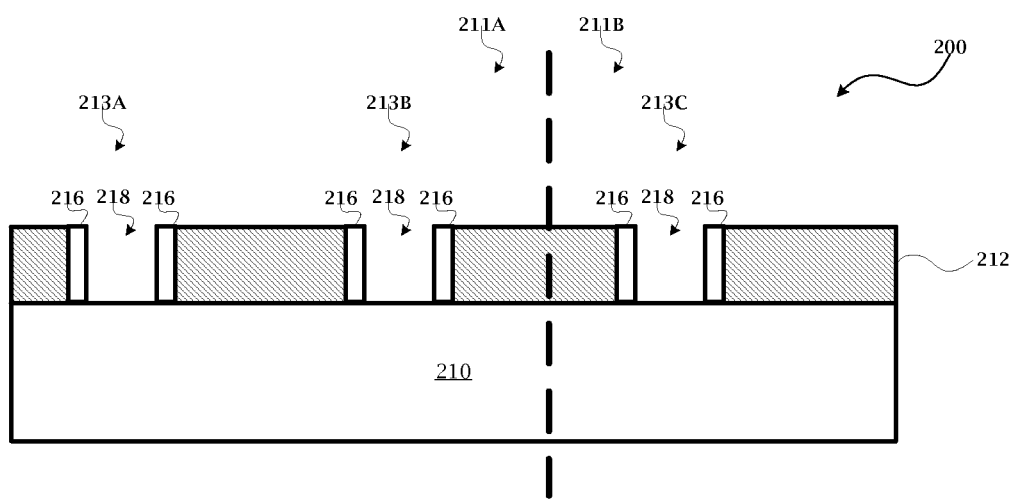

Referring to FIG. 1, the method 100 continues at step 104 by removing the at least one dummy gate layer from the at least one gate structure in the first and second regions of the substrate to form one or more trenches and/or recesses. Referring now to FIG. 2B, the dummy gate layers 214 are removed from the gate structures 213A, 213B, 213C in the first and second regions 211A, 211B, thereby creating trenches 218. The dummy gate layers 214 are removed by any suitable process. For example, the dummy gate layers 214 may be removed by a selective etching process. The selective etching process may employ a wet etching process, a dry etching process, or a combination wet and dry etching process. For example, a wet etching process may include exposure to a hydroxide containing solution (e.g., ammonium hydroxide), de-ionized water, and/or other suitable etchant solutions.

Figure 2C:
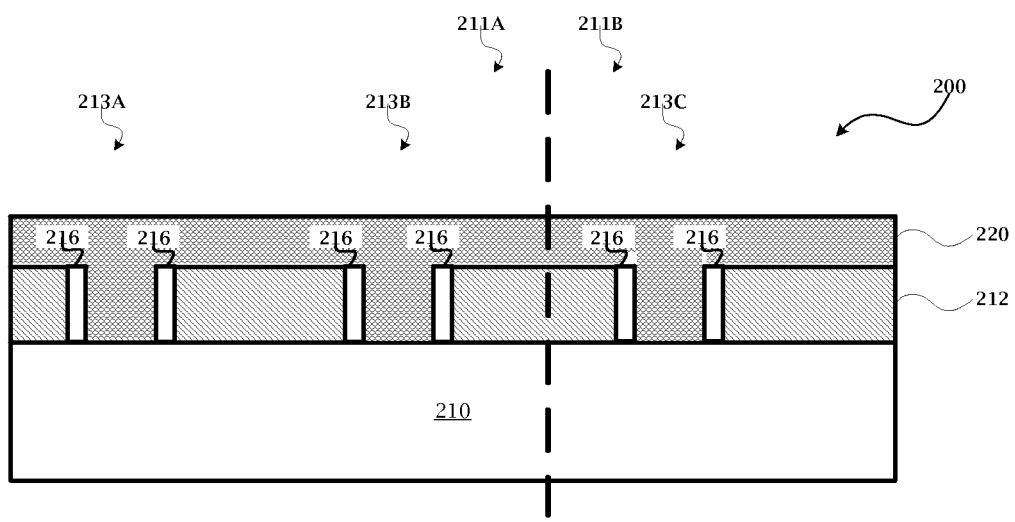

At step 106, a conductive layer is formed over the substrate, the conductive layer at least partially filling the one or more trenches in the first and second regions of the substrate. In the present embodiment, a conductive layer 220 is deposited over the semiconductor substrate 210, the conductive layer 220 filling the trenches 218 as illustrated in FIG. 2C. The conductive layer 220 is deposited by any suitable process, for example, CVD, PVD, ALD, sputtering, plating, other suitable methods, and/or combinations thereof. The conductive layer 220 comprises any suitable material and any suitable thickness. For example, the conductive layer 220 may comprise one or more layers comprising aluminum, copper, tungsten, titanium, tantalum, titanium nitride, tantalum nitride, nickel silicide, cobalt silicide, TaC, TaSiN, TaCN, TiAl, TiAlN; other suitable materials; and/or combinations thereof. Further, the conductive layer 220 may be doped polycrystalline silicon with the same or different doping. The conductive layer 220 may include work function layers, liner layers, interface layers, seed layers, adhesion layers, barrier layers, etc. For example, if a P-type work function metal (P-metal) for PMOS devices is desired, TiN, WN, or W may be used. On the other hand, if an N-type work function metal (N-metal) for NMOS devices is desired, TiAl, TiAlN, or TaCN, may be used.

Figure 2D:
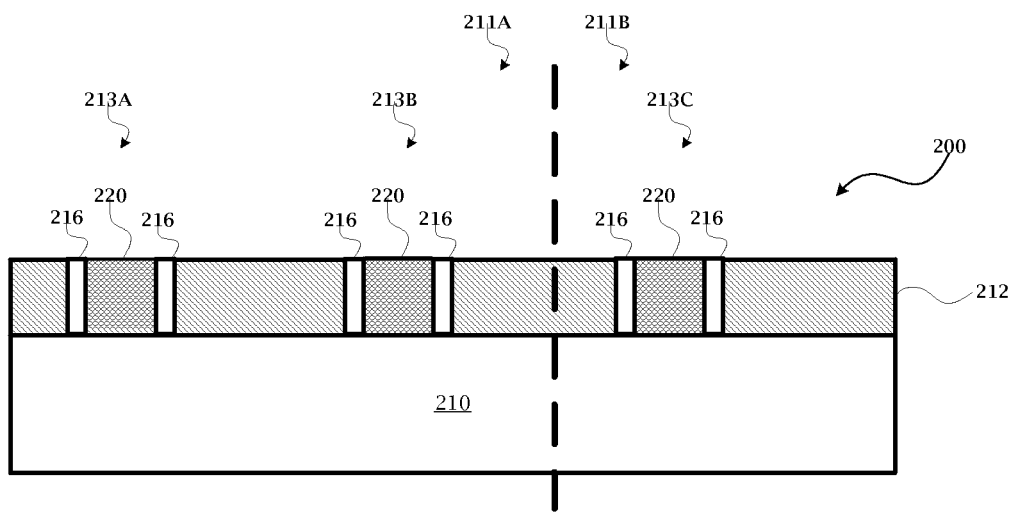

Thereafter, as illustrated in FIG. 2D, a chemical mechanical polishing (CMP) process may be performed on the conductive layer 220 to planarize and polish the conductive layer 220 until the dielectric layer 212 is reached. The CMP process forms gate structures 213A, 213B, 213C comprising spacers 216 and conductive layers 220 in the first and second regions 211A, 211B.

Conventional processing follows by forming a second layer (e.g., a second ILD layer) over the semiconductor device and forming one or more contact openings (or windows). The one or more contact openings (or windows) permit contact between one or more layers, one or more features, a part of the substrate and one or more layers, and/or a part of the substrate and one or more features of the semiconductor device. Due to the significant scaling down of semiconductor devices, and accordingly the space between features on a semiconductor device, the space separating the one or more contact openings (or windows) from nearby features of the semiconductor device has significantly decreased. It has been observed that conventional processing provides a smaller than desirable contact process window, which leads to restrictive processing and design issues. For example, the smaller contact process window results in design rules requiring a minimum spacing between the contact openings and device features (e.g., gate structures), which provides a smaller than desirable margin of contact/gate structure overlay. Further, if the minimum spacing between the contact openings and such device features varies, poor device performance results, such as contact/gate structure short and contact open issues.

Accordingly, the present embodiment provides a method wherein a selective etch back process and a protective layer formation process are incorporated to remedy the above discussed issues. By incorporating a selective etch back process and a protective layer formation process into conventional processing, the contact module process window is desirably enlarged. Essentially, the space between a contact and a gate is reduced significantly, allowing contact-gate structure spacing approaching zero and overlay of the contact and gate structure areas. Such reduction in contact-gate spacing significantly reduces the size of semiconductor devices. In some instances, the semiconductor device (for example, a static random access memory) size has been reduced as much as 33.4%. Further, because the protective layer is provided over one or gate structures, device performance issues such as shorting are eliminated. Thus, the present embodiment desirably enlarges the contact module process window while significantly reducing the size of semiconductor devices. In some embodiments, a novel self-aligned static random access memory on metal gate may arise from the present embodiments.

Figure 2E:
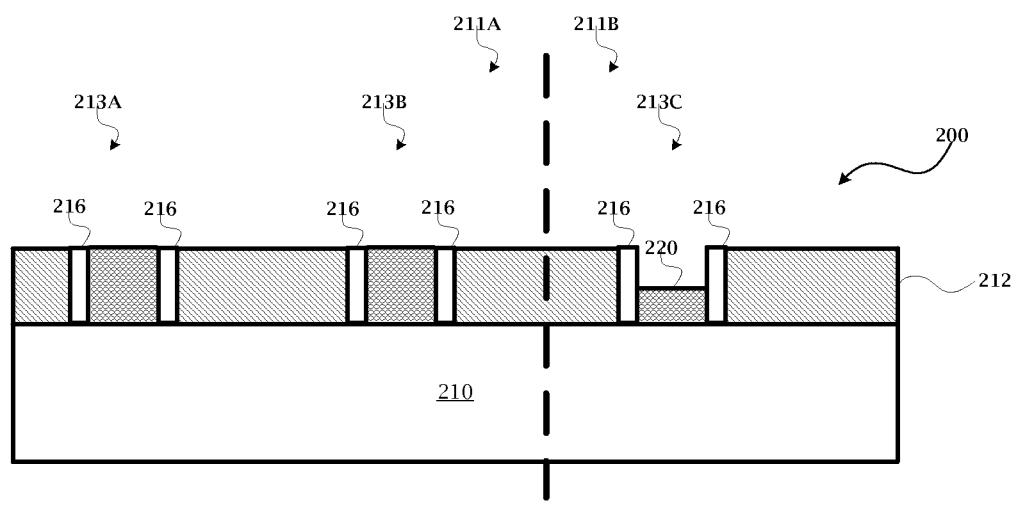

Referring to FIG. 1, the method 100 continues at step 108 with performing a selective etch back process on the conductive layer of the at least one gate structure in the second region of the substrate. FIG. 2E illustrates the conductive layer 220 of the at least one gate structure 213C in the second region 211B of the substrate 210 selectively etched back. The selective etching process may employ a wet etching process, a dry etching process, or a combination wet and dry etching process. For example, a wet etching process may include exposure to a hydroxide containing solution (e.g., ammonium hydroxide), de-ionized water, and/or other suitable etchant solutions. In another example, the dry etching process may implement a fluorine-containing plasma, and the etching gas may include $CF_4$, $Cl_2$, HBr, $O_2$, other suitable gasses, or combinations thereof.

Figure 2F:
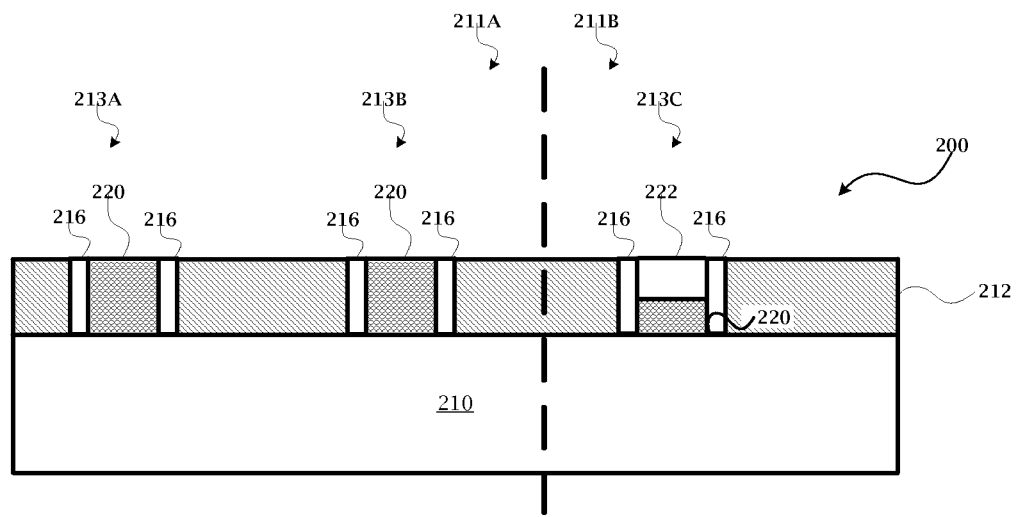

Referring to FIGS. 1 and 2F, at step 110, a protective layer is formed over the etched back conductive layer of at least one gate structure in the second region of the substrate. In the present embodiment, the protective layer 222 is formed over the conductive layer 220 of gate structure 213C in the second region 211B of the substrate 210. The protective layer 222 may be formed by any suitable process, such as PVD, CVD, plasma-enhanced CVD, rapid thermal CVD, ALD, metal-organic CVD, other suitable processes, and/or combinations thereof. In one example, forming the protective layer 222 may comprise depositing the protective layer 222 over the substrate 210, including over the conductive layer 220 of the at least one gate structure 213C in the second region 211B, and thereafter, performing a CMP process until the dielectric layer 212 is reached. The CMP process may leave the top surfaces of the conductive layer 220 of gate structures 213A, 213B and the protective layer 222 of gate structure 213C exposed. Further, the protective layer 222 may comprise any suitable material, such as silicon nitride, silicon oxide, silicon carbide, silicon oxynitride, amorphous carbon material, other suitable materials, and/or combinations thereof. The protective layer 222 may act as a hard mask layer over the conductive layer 222 of gate structure 213C during subsequent processing. In some embodiments, the protective layer 222 comprises the same material as the spacers 216. In the present embodiment, the protective layer 222 comprises silicon nitride.

Figure 2G:
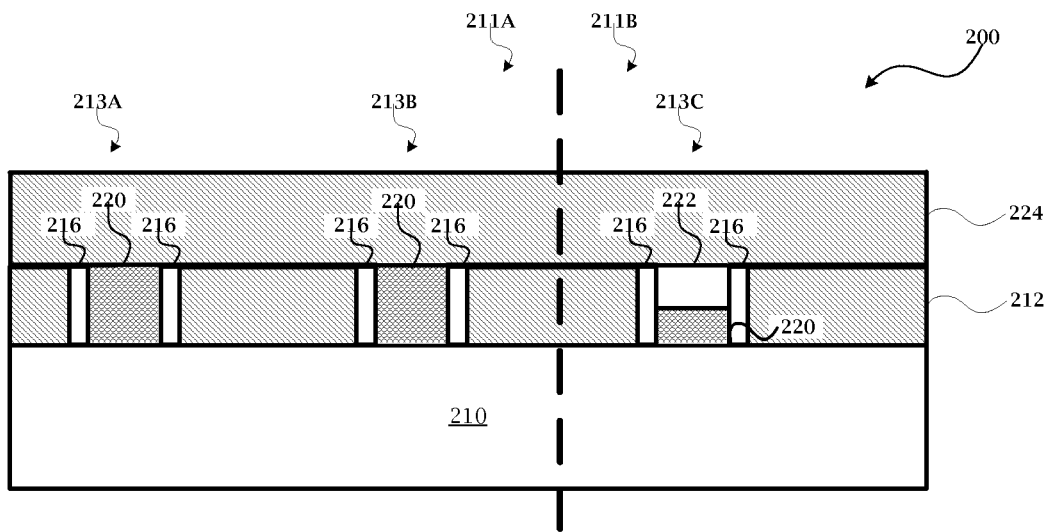

At step 112, one or more contact openings are formed in the first and second regions. For example, a butted contact opening and a self-aligned contact opening may be formed. Referring to FIG. 2G, a dielectric layer 224 is deposited over the substrate 210. In the present embodiment, the dielectric layer 224 is also deposited over the dielectric layer 212 and gate structures 213A, 213B, 213C. The dielectric layer 224 may be deposited by any suitable process including by CVD, high density plasma CVD, PVD, ALD, sputtering, spin-on coating, and/or other suitable methods. The dielectric layer 224 comprises a dielectric layer, such as an interlayer (or interlevel) dielectric (ILD) layer. The dielectric layer 224 may include any suitable dielectric material including TEOS oxide, silicon oxide, silicon nitride, silicon oxynitride, hafnium oxide, zirconium oxide, titanium oxide, aluminum oxide, hafnium dioxide-alumina (HfO2-Al2O3) alloy, PSG, BPSG, fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper porous polymeric materials, other suitable materials, and/or combinations thereof. The dielectric layer 224 may further include a multilayer structure comprising multiple dielectric materials. Further, the dielectric layer 224 may be formed at any suitable thickness. It is understood that additional layers, such as interfacial layers, capping layers, barrier layers, and/or buffer layers, may be formed overlying and/or underlying the dielectric layer 224. In some embodiments, the dielectric layer 224 may comprise the same material as the dielectric layer 212.

Figure 2H:
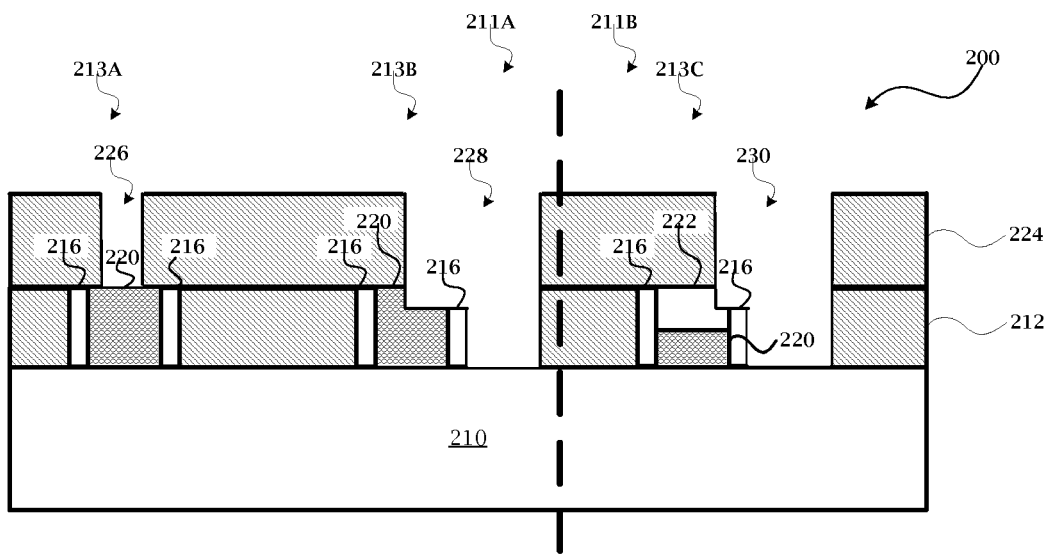

One or more contact openings 226, 228, 230 are formed in the first and second regions 211A, 211B. The one or more contact openings 226, 228, 230 may be formed through the dielectric layer 212 and dielectric layer 224 as shown in FIG. 2H. The one or more contact openings 226, 228, 230 may be formed by any suitable process. For example, the contact openings 226, 228, 230 may be formed by one or more conventional photolithography patterning processes, etching processes, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the contact openings 226, 228, 230 may be formed by any combination of the processes described above.

In one example, for patterning the contact openings 226, 228, 230, a layer of photoresist is formed over the dielectric layer 224 by a suitable process, such as spin-on coating, and then patterned to form a patterned photoresist feature by a proper lithography patterning method. The pattern of the photoresist can then be transferred by a dry etching process to the underlying layers (i.e., dielectric layer 212, spacers 216 and conductive layers 220 of gate structures 213A, 213B, the spacers 216 and protective layer 222 of gate structure 213C, and the dielectric layer 224) to form the contact openings 226, 228, 230 as shown in FIG. 2H. The photoresist layer may be stripped thereafter. It is understood that the above example does not limit the processing steps that may be utilized to form the contact openings 226, 228.

In the present embodiment, the contact opening 226 comprises a poly contact opening, the contact opening 228 comprises a butted contact opening, and the contact opening 230 comprises a self-aligned contact opening. As noted above, the substrate 210 may further comprise S/D regions, wherein the contact openings 228, 230 provide openings to form contacts to the S/D regions. Thereafter, it is understood that the semiconductor device 200 may undergo further CMOS or MOS technology processing to form various features known in the art. In still another example, various contacts/vias and multilayer interconnect features (e.g., metal layers and interlayer dielectrics) may be formed on the substrate 210 and configured to connect the various features or structures of the semiconductor device 200. For example, in the present embodiment, the contact openings 226, 228, 230 may be filled with any suitable material to provide contact to the substrate or various features of the semiconductor device 200.

Figure 3:
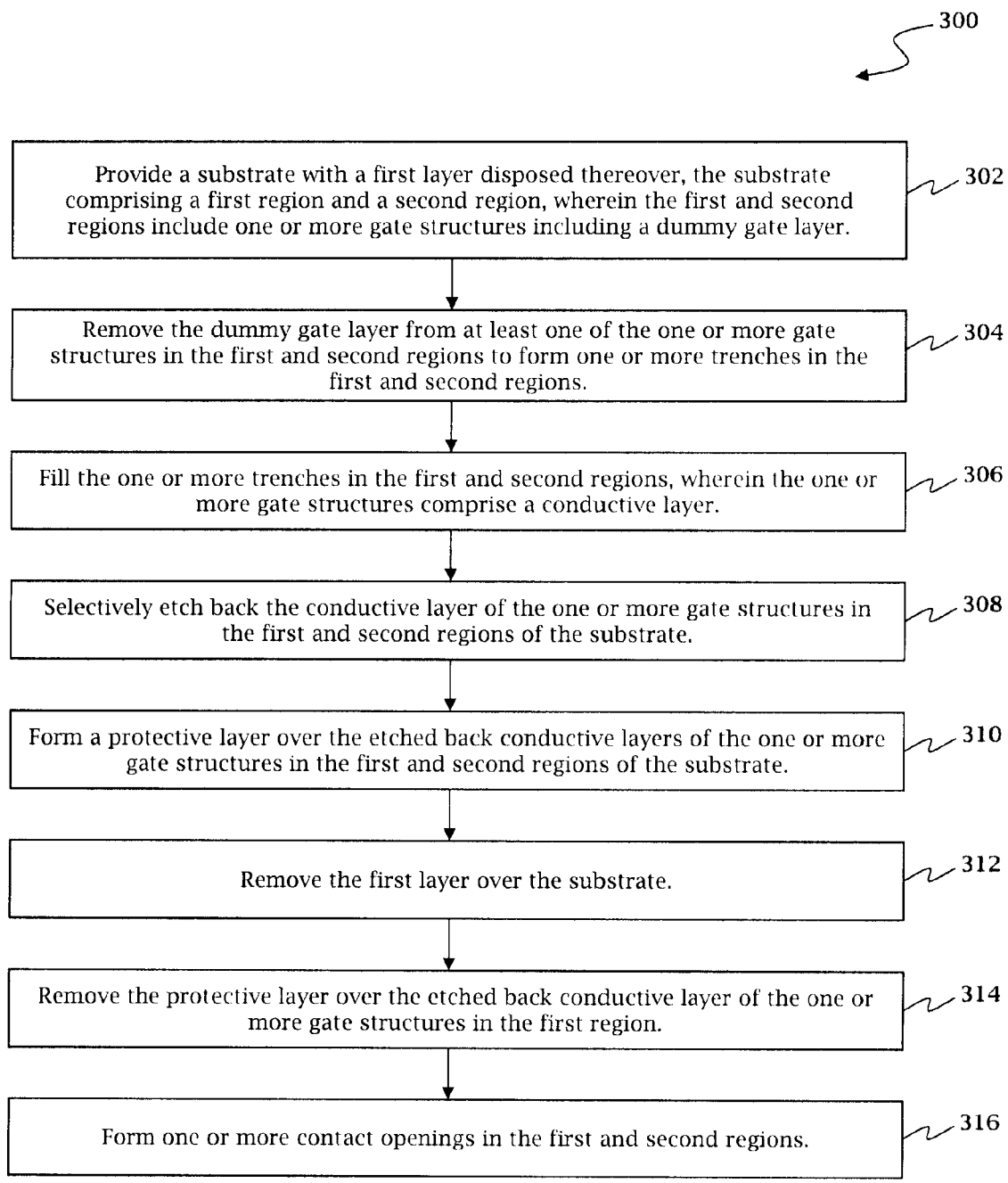
FIG. 3 is a flow chart of a method for fabricating a semiconductor device according to aspects of the present embodiments.
Figure 4A:
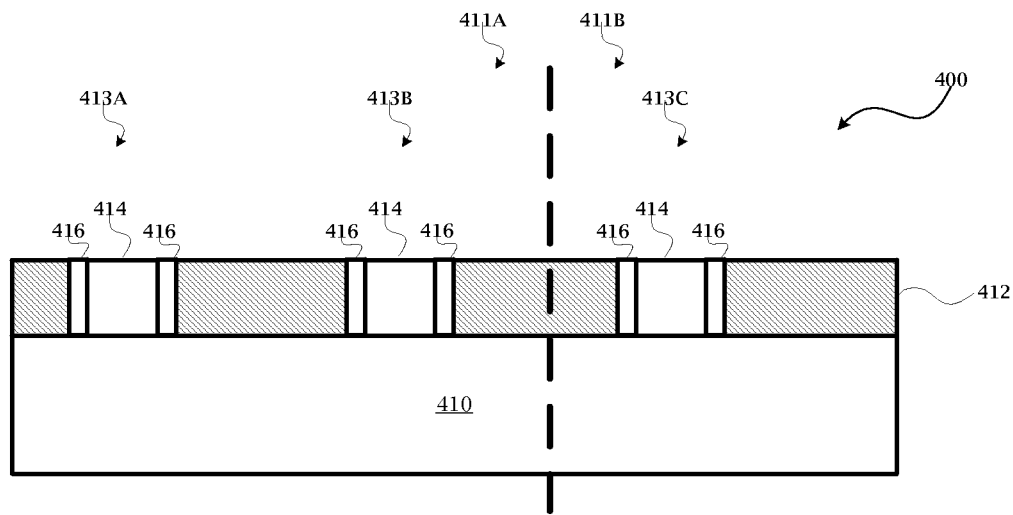
FIGS. 4A-4L are various cross-sectional views of embodiments of a semiconductor device during various fabrication stages according to the method of FIG. 3.

FIG. 3 is a flow chart of one embodiment of the method 300 for making the semiconductor device 400. FIGS. 4A-4L are various cross-sectional views of the semiconductor device 400 according to one embodiment, in portion or entirety, during various fabrication stages of the method 300. Referring to FIGS. 3 and 4A, the method 300 begins at step 302 wherein a substrate 410 including first and second regions 411A, 411B is provided. It is understood that the substrate 410 may include a plurality of first and second regions 411A, 411B.

In the present embodiment, the substrate 410 is a semiconductor substrate. The substrate 410 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator (SOI) or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In some embodiments, the semiconductor substrate 410 may comprise glass.

A dielectric layer 412 is disposed over the substrate 410, such as an interlayer (or inter-level) dielectric (ILD) layer. The dielectric layer 412 may be any suitable dielectric material including TEOS oxide, silicon oxide, silicon nitride, silicon oxynitride, hafnium oxide, zirconium oxide, titanium oxide, aluminum oxide, hafnium dioxide-alumina ($HfO_2$—$Al_2O_3$) alloy, PSG, BPSG, other suitable dielectric materials, and/or combinations thereof. In some embodiments, the dielectric layer 412 may comprise a low-k dielectric material, such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper porous polymeric materials, and/or combinations thereof. The dielectric layer 412 may be formed by any suitable process including by chemical vapor deposition (CVD), high density plasma CVD, spin-on, sputtering, spin-on coating, and/or other suitable methods. The dielectric layer 412 may further include a multilayer structure comprising multiple dielectric materials. Further, the dielectric layer 412 may be formed at any suitable thickness. It is understood that additional layers, such as interfacial layers, capping layers, barrier layers, and/or buffer layers, may be formed overlying and/or underlying the dielectric layer 412.

Further, in the present embodiment, disposed over the substrate 410, the first region 411A includes one or more gate structures 413A, 413B comprising a dummy gate layer 414 and spacers 416, and the second region 411B includes one or more gate structures 413C comprising a dummy gate layer 414 and spacers 416.

The gate structures 413A, 413B, 413C may be formed by any suitable process. For example, the gate structures 413A, 413B, 413C may be formed by conventional deposition, photolithography patterning, and etching processes, and/or combinations thereof. The deposition processes may include chemical vapor deposition (CVD), physical vapor deposition (PVD), atomic layer deposition (ALD), sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the at least one gate structures may be formed simultaneously, utilizing the same processing steps and processing materials; independently of one another, utilizing varying processing steps and processing materials; or using a combination of simultaneous and independent processing steps and processing materials.

The dummy gate layers 414 may comprise a multilayer structure comprising multiple dielectric materials. The dummy gate layers 414 may comprise a layer including a high-k dielectric material, which may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, HfSiO, HfSiON, HfTaO, HfTaTiO, HfTiO, HfZrO, HfAlON, other suitable high-k dielectric materials, and/or combinations thereof. The dummy gate layers 414 may comprise a layer including a dielectric material, such as silicon-containing materials including polycrystalline silicon, silicon oxide, silicon nitride, silicon oxynitride, and silicon carbide; germanium-containing materials; hafnium oxide, zirconium oxide, titanium oxide, aluminum oxide, hafnium dioxide-alumina ($HfO_2$—$Al_2O_3$) alloy, other suitable dielectric materials, and/or combinations thereof. In some embodiments, the dummy gate layers 414 may comprise a layer of silicon dioxide and a layer of high-k dielectric material. Further, the dummy gate layers 414 may be doped polycrystalline silicon with the same or different doping. It is understood that additional layers may be included in the dummy gate layers 414, such as interfacial layers, capping layers, barrier layers, and/or buffer layers. In the present embodiment, the dummy gate layers 414 comprise polysilicon.

The spacers 416, which may be positioned on each side of the dummy gate layers 414, may comprise a dielectric material, such as silicon nitride, silicon oxide, silicon carbide, silicon oxynitride, other suitable materials, and/or combinations thereof. In the present embodiment, the spacers 416 comprise silicon nitride. The spacers 416 may be formed by any suitable process. The spacers 416 may further include gate liner layers. In some embodiments, the spacers 416 may comprise a multilayer structure. In some embodiments, the spacers 416 may be omitted partially or entirely.

Figure 4B:
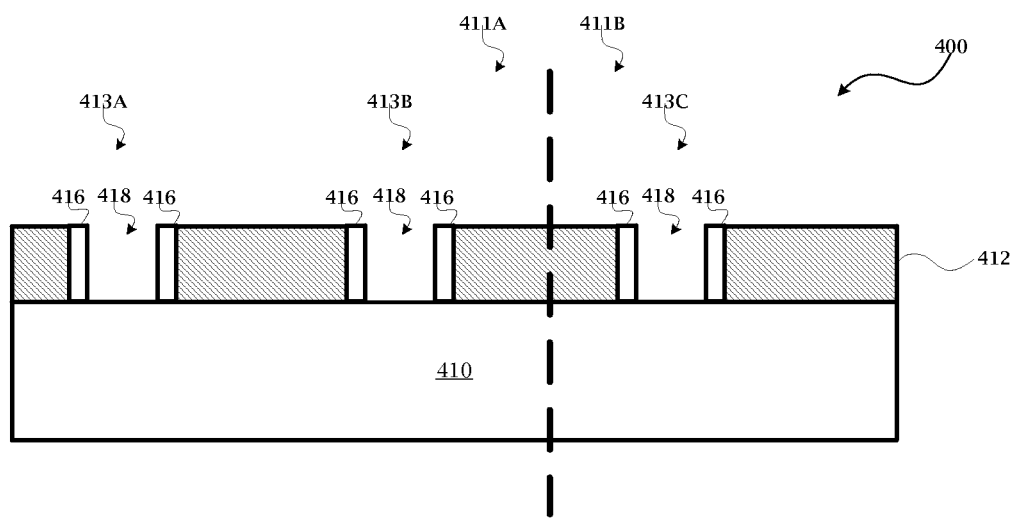

Referring to FIG. 3, the method 300 continues at step 304 by removing the dummy gate layers from at least one of the one or more gate structures in the first and second regions of the substrate to form one or more trenches and/or recesses. Referring now to FIG. 4B, the dummy gate layers 414 are removed from the gate structures 413A, 413B, 413C in the first and second regions 411A, 411B, thereby creating trenches 418. The dummy gate layers 414 are removed by any suitable process. For example, the dummy gate layers 414 may be removed by a selective etching process. The selective etching process may employ a wet etching process, a dry etching process, or a combination wet and dry etching process. For example, a wet etching process may include exposure to a hydroxide containing solution (e.g., ammonium hydroxide), de-ionized water, and/or other suitable etchant solutions.

Figure 4C:
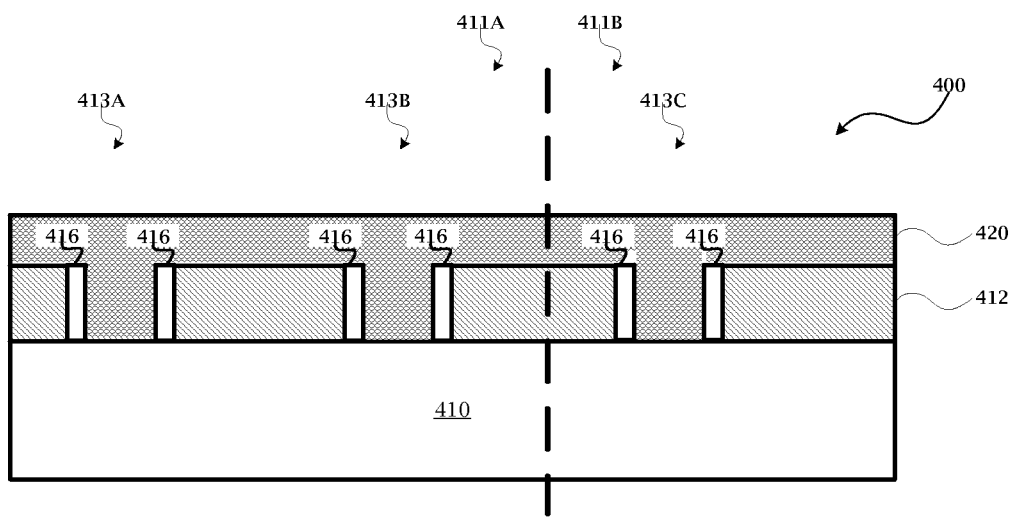

At step 306, a conductive layer is formed over the substrate, the conductive layer at least partially filling the one or more trenches in the first and second regions of the substrate. In the present embodiment, a conductive layer 420 is deposited over the semiconductor substrate 410, the conductive layer 420 filling the trenches 418 as illustrated in FIG. 4C. The conductive layer 420 is deposited by any suitable process, for example, CVD, PVD, ALD, sputtering, plating, other suitable methods, and/or combinations thereof. The conductive layer 420 comprises any suitable material and any suitable thickness. For example, the conductive layer 420 may comprise one or more layers comprising aluminum, copper, tungsten, titanium, tantulum, titanium nitride, tantalum nitride, nickel silicide, cobalt silicide, TaC, TaSiN, TaCN, TiAl, TiAlN; other suitable materials; and/or combinations thereof. Further, the conductive layer 420 may be doped polycrystalline silicon with the same or different doping. The conductive layer 420 may include work function layers, liner layers, interface layers, seed layers, adhesion layers, barrier layers, etc. For example, if a P-type work function metal (P-metal) for PMOS devices is desired, TiN, WN, or W may be used. On the other hand, if an N-type work function metal (N-metal) for NMOS devices is desired, TiAl, TiAlN, or TaCN, may be used.

Figure 4D:
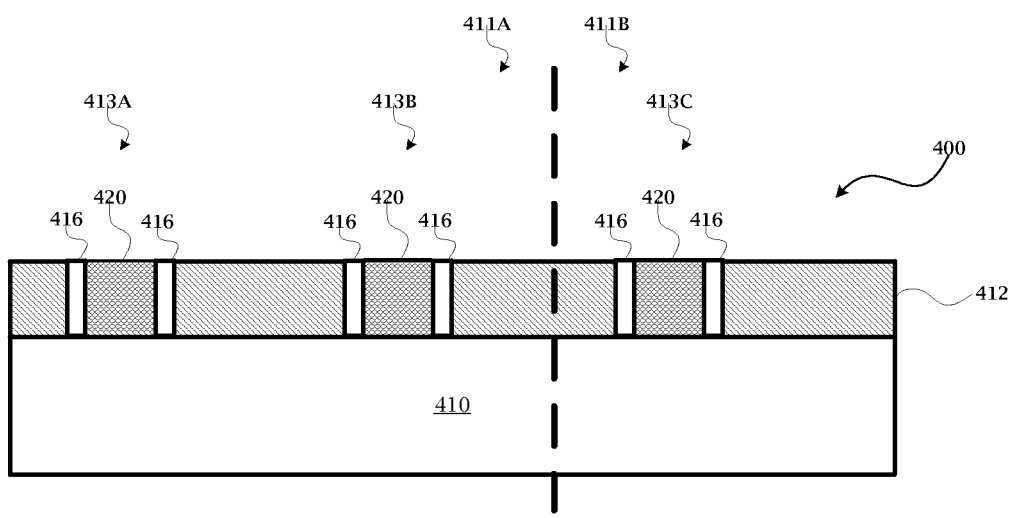

Thereafter, as illustrated in FIG. 4D, a chemical mechanical polishing (CMP) process may be performed on the conductive layer 420 to planarize and polish the conductive layer 420 until the dielectric layer 412 is reached. The CMP process forms gate structures 413A, 413B, 413C comprising spacers 416 and conductive layers 420 in the first and second regions 411A, 411B.

As discussed above, conventional processing follows by forming a second layer (e.g., a second ILD layer) over the semiconductor device and forming one or more contact openings (or windows). The one or more contact openings (or windows) permit contact between one or more layers, one or more features, a part of the substrate and one or more layers, and/or a part of the substrate and one or more features of the semiconductor device. Due to the significant scaling down of semiconductor devices, and accordingly the space between features on a semiconductor device, the space separating the one or more contact openings (or windows) from nearby features of the semiconductor device has significantly decreased. It has been observed that conventional processing provides a smaller than desirable contact process window, which leads to restrictive processing and design issues. For example, the smaller contact process window results in design rules requiring a minimum spacing between the contact openings and device features (e.g., gate structures), which provides a smaller than desirable margin of contact/gate structure overlay. Further, if the minimum spacing between the contact openings and such device features varies, poor device performance results, such as contact/gate structure short and contact open issues.

Accordingly, the present embodiment provides a method wherein a selective etch back process and a protective layer formation process are incorporated to remedy the above discussed issues. By incorporating a selective etch back process and a protective layer formation process into conventional processing, the contact module process window is desirably enlarged. Essentially, the space between a contact and a gate is reduced significantly, allowing contact-gate structure spacing approaching zero and overlay of the contact and gate structure areas. Such reduction in contact-gate spacing significantly reduces the size of semiconductor devices. In some instances, the semiconductor device (for example, a static random access memory) size has been reduced as much as 33.4%. Further, because the protective layer is provided over one or gate structures, device performance issues such as shorting are eliminated. Thus, the present embodiment desirably enlarges the contact module process window while significantly reducing the size of semiconductor devices.

Figure 4E:
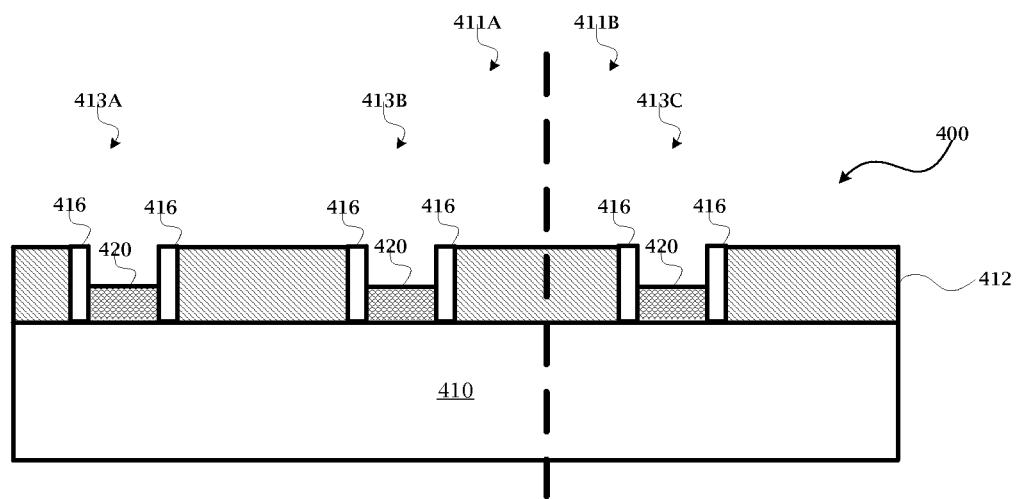

Referring to FIG. 3, the method 300 continues at step 308 with performing a selective etch back process on the conductive layers of the one or more gate structures in the first and second regions of the substrate. FIG. 4E illustrates the conductive layers 420 of the gate structures 413A, 413B in the first region 411A and the gate structure 413C in the second region 411B of the substrate 410 selectively etched back. The selective etching process may employ a wet etching process, a dry etching process, or a combination wet and dry etching process. For example, a wet etching process may include exposure to a hydroxide containing solution (e.g., ammonium hydroxide), de-ionized water, and/or other suitable etchant solutions. In another example, the dry etching process may implement a fluorine-containing plasma, and the etching gas may include $CF_4$, $Cl_2$, HBr, $O_2$, other suitable gasses, or combinations thereof.

Figure 4F:
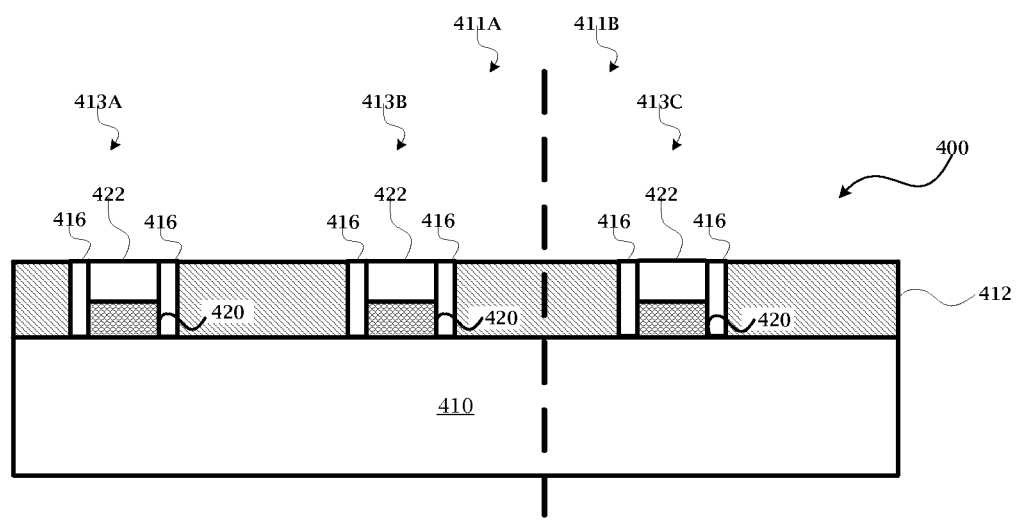

Referring to FIGS. 3 and 4F, at step 310, a protective layer is formed over the etched back conductive layers of the one or more gate structures in the first and second regions of the substrate. In the present embodiment, the protective layer 422 is formed over the etched back conductive layers 420 of gate structures 413A, 413B in the first region 411A and the etched back conductive layer 420 of gate structure 413C in the second region 411B of the substrate 410. The protective layer 422 may be formed by any suitable process, such as PVD, CVD, plasma-enhanced CVD, rapid thermal CVD, ALD, metal-organic CVD, other suitable processes, and/or combinations thereof. In one example, forming the protective layer 422 may comprise depositing the protective layer 422 over the substrate 410, including over the conductive layers 420 of the gate structures 413A, 413B, 413C, and thereafter, performing a CMP process until the dielectric layer 412 is reached. The CMP process may leave the top surfaces of the protective layer 422 of gate structures 413A, 413B, 413C exposed. Further, the protective layer 422 may comprise any suitable material, such as silicon nitride, silicon oxide, silicon carbide, silicon oxynitride, amorphous carbon material, other suitable materials, and/or combinations thereof. The protective layer 422 may act as a hard mask layer over the conductive layers 420 of gate structures 413A, 413B, 413C during subsequent processing. In some embodiments, the protective layer 422 comprises the same material as the spacers 416. In the present embodiment, the protective layer 422 comprises silicon nitride.

Figure 4G:
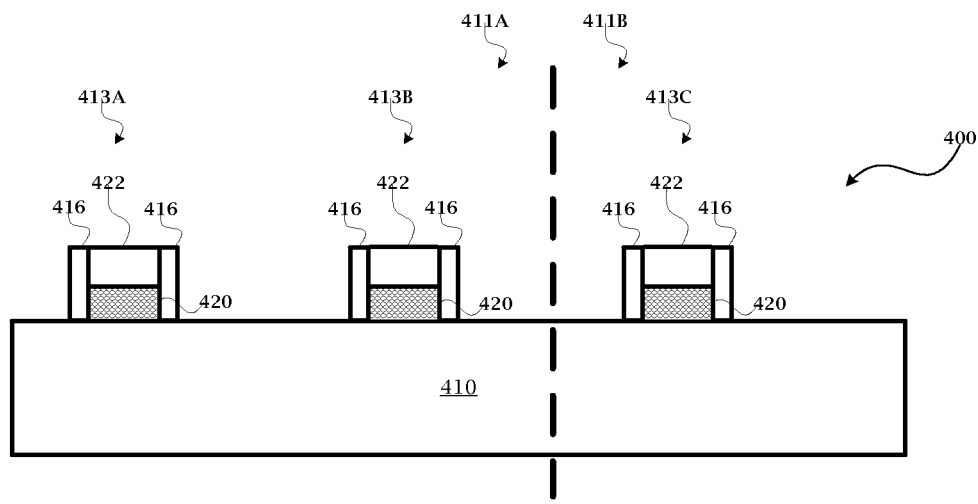

At step 312, the dielectric layer over the substrate is removed. Referring to FIG. 4G, the dielectric layer 412 may be removed from the substrate 410 by any suitable process, such as an etching process. The etching process may comprise dry etching, wet etching, and/or other etching methods (e.g., reactive ion etching). The etching process may also be either purely chemical (plasma etching), purely physical (ion milling), and/or combinations thereof. It is understood that the semiconductor device 400 may undergo further processing, wherein the semiconductor device 400 will comprise additional features known in the art. For example, the semiconductor device 400 may further comprise isolation regions (e.g., shallow trench isolation (STI) and/or local oxidation of silicon (LOCOS)), lightly doped source/drain regions (LDD regions), source/drain (S/D) regions, and/or silicide regions.

Figure 4H:
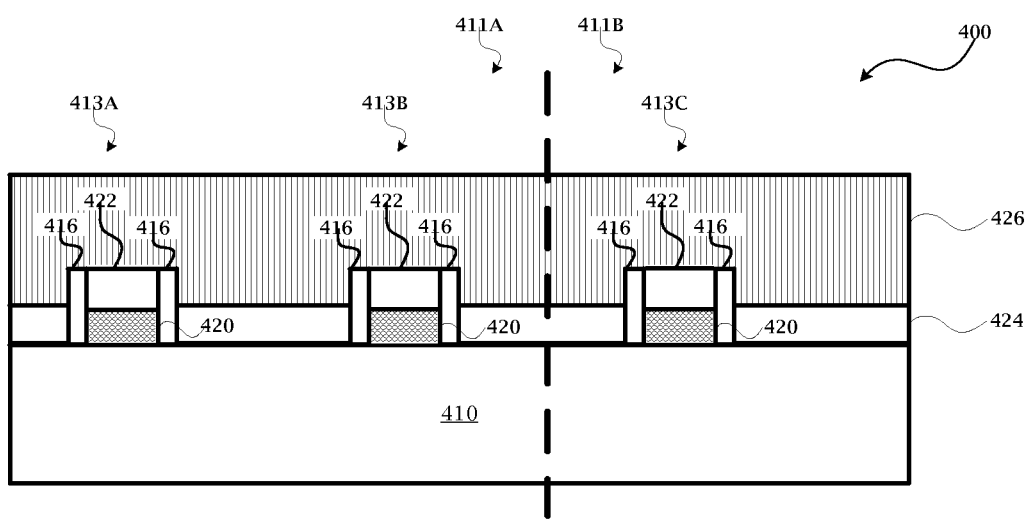

Subsequently, at step 314, the protective layer over the etched back conductive layer of the one or more gate structures in the first region is removed. In the present embodiment, the protective layer 422 is removed over the gate structures 413A, 413B in the first region 411A of the substrate 410 (i.e., the protective layers 422 are removed from over the etched back conductive layers 420 of gate structures 413A, 413B). Such removal may be accomplished by any suitable process. For example, in the present embodiment, an antireflective coating layer 424 and a photoresist layer 426 are disposed over the semiconductor substrate 410 including the gate structures 413A, 413B, 413C as illustrated in FIG. 4H. The antireflective coating layer 424 and photoresist layer 426 may comprise any suitable material and any suitable thickness. Further, the antireflective coating 424 and photoresist layer 426 may be disposed over the substrate 410 by any suitable process, such as CVD, high density plasma CVD, PVD, ALD, sputtering, spin-on coating, other suitable methods, and/or combinations thereof. It is understood that, in alternate embodiments, the antireflective coating layer 424 may be omitted partially or entirely and/or a top antireflective coating layer may be disposed over the semiconductor substrate 410.

Figure 4I:
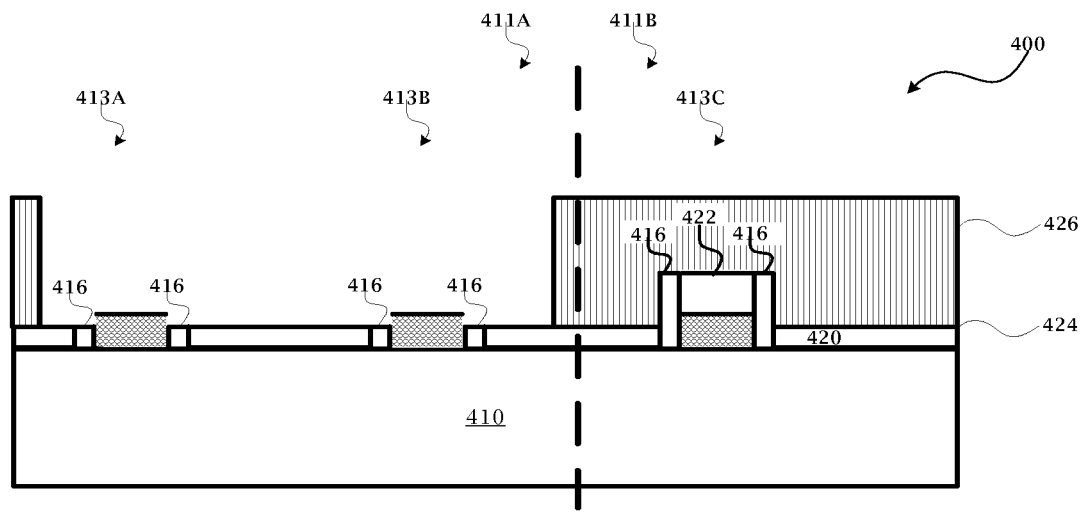

Referring to FIG. 4I, the photoresist layer 426 is patterned and etched to expose the gate structures 413A, 413B in first region 411A of the substrate, particularly the protective layers 422 of the gate structures 413A, 413B. The patterning process may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography patterning and exposing process may also be implemented or replaced by other proper methods such as maskless photolithography, electron-beam writing, ion-beam writing, and molecular imprint. The etching process may include dry etching, wet etching, and/or other etching methods (e.g., reactive ion etching). The etching process may also be either purely chemical (plasma etching), purely physical (ion milling), and/or combinations thereof. It is understood that the gate structures 413A, 413B may be exposed by any combination of the processes described above.

Figure 4J:
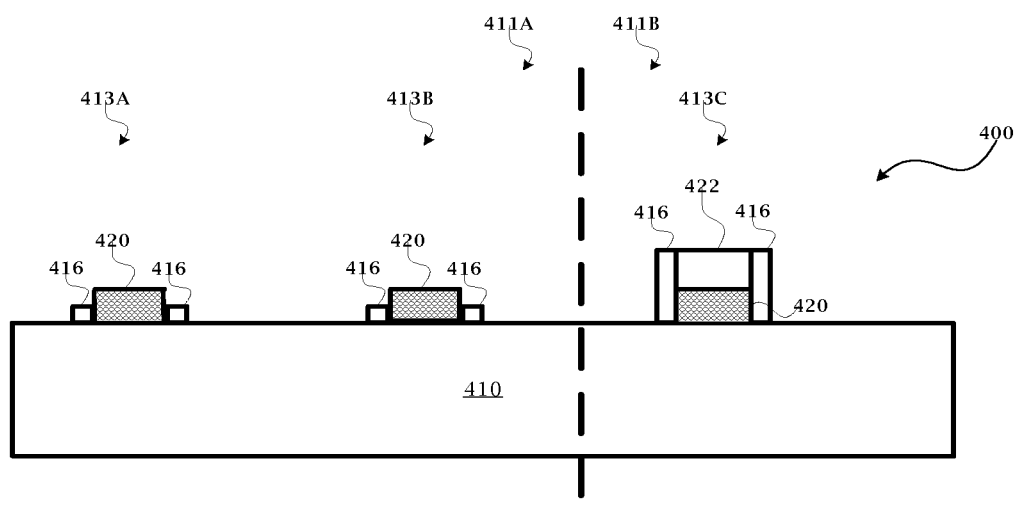

The exposed protective layers 422 of the gate structures 413A, 413B are then removed to expose the top surface of the conductive layers 420 of the gate structures 413A, 413B. The protective layers 422 may be removed by any suitable process, for example, by a selective etching process. The antireflective layer 424 and photoresist layer 426 may be stripped thereafter as shown in FIG. 4J.

Figure 4K:
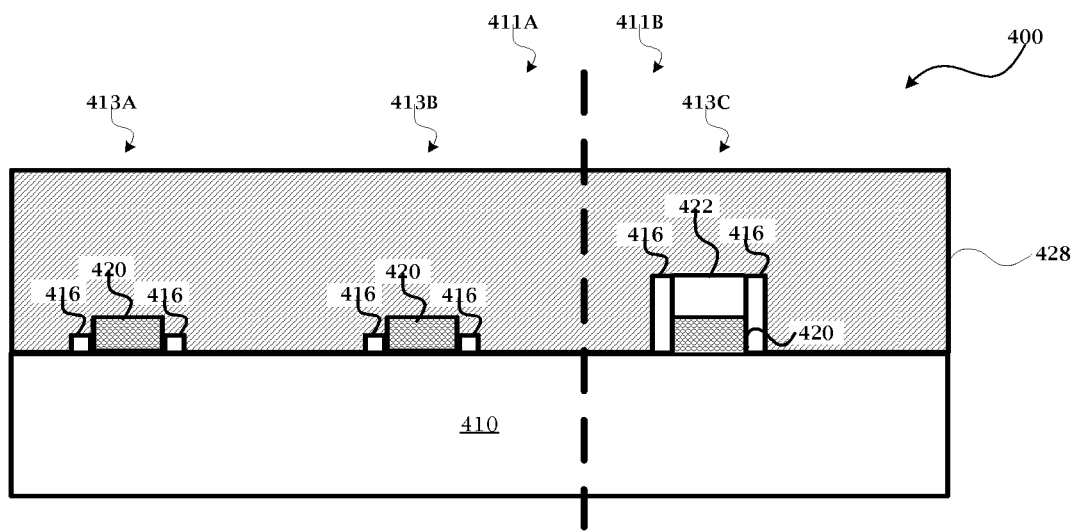

At step 316, one or more contact openings are formed in the first and second regions. For example, a poly contact opening, a butted contact opening, and a self-aligned contact opening may be formed. Referring to FIG. 4K, a dielectric layer 428 is deposited over the substrate 410. In the present embodiment, the dielectric layer 428 is also deposited over the gate structures 413A, 413B, 413C. The dielectric layer 428 may be deposited by any suitable process including by CVD, high density plasma CVD, PVD, ALD, sputtering, spin-on coating, and/or other suitable methods. The dielectric layer 428 comprises a dielectric layer, such as an interlayer (or interlevel) dielectric (ILD) layer. The dielectric layer 428 may include any suitable dielectric material including TEOS oxide, silicon oxide, silicon nitride, silicon oxynitride, hafnium oxide, zirconium oxide, titanium oxide, aluminum oxide, hafnium dioxide-alumina (HfO2-Al2O3) alloy, PSG, BPSG, fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper porous polymeric materials, other suitable materials, and/or combinations thereof. The dielectric layer 428 may further include a multilayer structure comprising multiple dielectric materials. Further, the dielectric layer 428 may be formed at any suitable thickness. It is understood that additional layers, such as interfacial layers, capping layers, barrier layers, and/or buffer layers, may be formed overlying and/or underlying the dielectric layer 428.

Figure 4L:
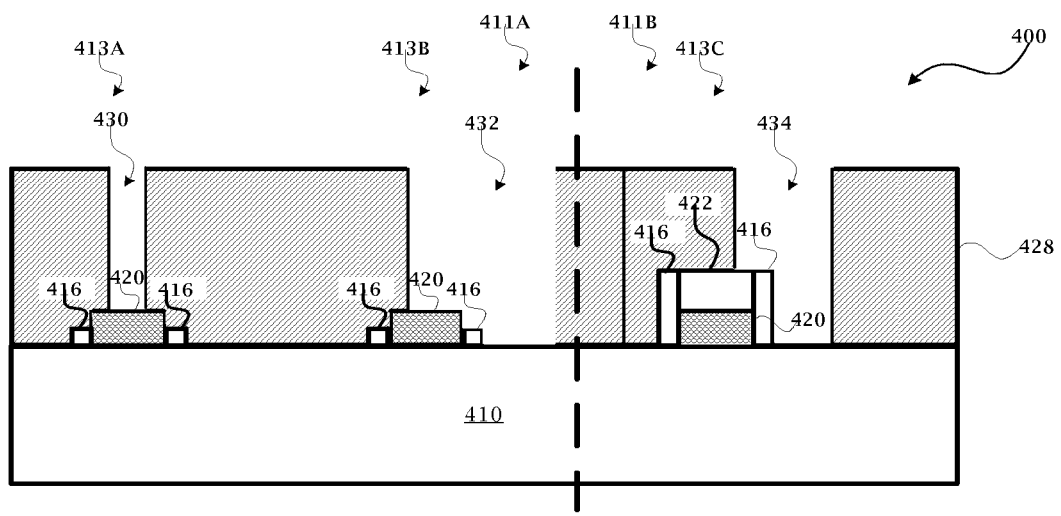

Then, one or more contact openings 430, 432, 434 are formed in the first and second regions. The one or more contact openings 430, 432, 434 may be formed through the dielectric layer 428 as shown in FIG. 4L. The one or more contact openings 430, 432, 434 may be formed by any suitable process. For example, the contact openings 430, 432, 434 may be formed by one or more conventional photolithography patterning processes, etching processes, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the contact openings 430, 432, 434 may be formed by any combination of the processes described above.

In one example, for patterning the contact openings 430, 432, 434, a layer of photoresist is formed over the dielectric layer 428 by a suitable process, such as spin-on coating, and then patterned to form a patterned photoresist feature by a proper lithography patterning method. The pattern of the photoresist can then be transferred by a dry etching process to the underlying layers (i.e., dielectric layer 428) to form the contact openings 430, 432, 434 as shown in FIG. 4L. The photoresist layer may be stripped thereafter. It is understood that the above example does not limit the processing steps that may be utilized to form the contact openings 430, 432, 434. In the present embodiment, the contact opening 430 comprises a poly contact opening (i.e., providing contact to gate structure 413A), the contact opening 432 comprises a butted contact opening (i.e., providing contact to gate structure 413B and/or the substrate (e.g., a S/D region)), and the contact opening 434 comprises a self-aligned contact opening (i.e., providing contact to the substrate (e.g., S/D region)). As noted above, the substrate 410 may further comprise S/D regions, wherein the contact openings 432, 434 provide openings to form contacts to the S/D regions.

Thereafter, it is understood that the semiconductor device 400 may undergo further CMOS or MOS technology processing to form various features known in the art. In still another example, various contacts/vias and multilayer interconnect features (e.g., metal layers and interlayer dielectrics) may be formed on the substrate 410 and configured to connect the various features or structures of the semiconductor device 400. For example, in the present embodiment, the contact openings 430, 432, 434 may be filled with any suitable material to provide contact to the substrate or various features of the semiconductor device 400.

Overall, the disclosed embodiments provide one or more of the following advantages: (1) improves overall device performance (for example, by preventing contact/gate structure short and contact open issues); (2) enlarges the contact module process window; (3) reduces the size of semiconductor devices; (4) allows contact/gate structure overlap, essentially allowing the spacing between contacts and gate structures to approach zero; and (4) reduces design space between contacts and semiconductor device features. In one embodiment, a method for fabricating an integrated circuit comprises providing a semiconductor substrate providing a substrate including a first region and a second region, the first and second regions having one or more gate structures including a dummy gate layer; removing the dummy gate layer from at least one of the one or more gate structures in the first and second regions to form one or more trenches in the first and second regions; filling the one or more trenches in the first and second regions with a conductive layer; selectively etching back the conductive layer of the one or more gate structures in the second region of the substrate; forming a protective layer over the etched back conductive layer of the one or more gate structures in the second region; and forming one or more contact openings in the first and second regions.

The method further comprises forming a first layer over the substrate. The method may further comprise performing a chemical mechanical polishing (CMP) process after filling the one or more trenches in the first and second regions; and performing a CMP process after forming the protective layer over the etched back conductive layer of the one or more gate structures in the second region. In some embodiments, each of the CMP processes stops at the first layer. Forming the one or more contact openings in the first and second regions may comprise forming a second layer over the semiconductor substrate; and performing a patterning and/or etching process on the first layer and the second layer. In some embodiments, forming the one or more contact openings in the first and second regions may comprise forming a butted contact opening in the first region; and forming a self-aligned contact opening in the second region. In some embodiments, the integrated circuit includes a static random access memory (SRAM). The protective layer may comprise a hard mask layer.

In one embodiment, a method for fabricating an integrated circuit comprises providing a substrate including a first region and a second region, wherein the first and second regions comprise at least one gate structure comprising a dummy gate layer; forming a first layer over the substrate; removing the dummy gate layer from one or more of the at least one gate structures in the first and second regions to form one or more trenches in the first and second regions; filling the one or more trenches in the first and second regions with a conductive layer; selectively etching back the conductive layer of the one or more gate structures in the first and second regions of the substrate; forming a protective layer over the etched back conductive layers of the one or more gate structures in the first and second regions of the substrate; removing the first layer over the substrate; removing the protective layer over the etched back conductive layers of the one or more gate structures in the first region; and forming one or more contact openings in the first and second regions.

The method may further comprise selectively etching back the dummy gate layer from one or more of the at least one gate structures in the first and second regions; forming a protective layer over the etched back dummy gate layers of the one or more gate structures in the first and second regions; and removing the protective layer over the etched back dummy gate layers of the one or more gate structures in the first region. The method may further comprise performing a chemical mechanical polishing (CMP) process after filling the one or more trenches in the first and second regions with a conductive layer; and performing a CMP process after forming a protective layer over the etched back conductive layers of the one or more gate structures in the first and second regions of the substrate.

In some embodiments, removing the protective layer over the etched back conductive layer of the one or more gate structures in the first region comprises forming a patterning layer over the substrate; etching the patterning layer to expose the protective layer of the one or more gate structures in the first region of the substrate; selectively etching the protective layer of the one or more gate structure in the first region of the substrate. The method may further comprise removing the patterning layer over the substrate and/or forming one or more antireflective layers over the substrate.

In some embodiments, forming the one or more contact openings in the first and second regions comprises forming a second layer over the semiconductor substrate; and performing a patterning and/or etching process on the second layer. In some embodiments, forming the one or more contact openings in the first and second regions comprises forming a poly contact opening and a butted contact opening in the first region; and forming a self-aligned contact opening in the second region.

In another embodiment, a method for fabricating an integrated circuit comprises providing a substrate; forming one or more gate structures comprising a conductive layer and one or more gate structures comprising a dummy gate layer over the substrate; selectively etching back the conductive layer of at least one of the one or more gate structures and the dummy gate layer of at least one of the one or more gate structures; forming a protective layer over the etched back conductive layer of at least one of the one or more gate structures and the etched back dummy gate layer of the at least one of the one or more gate structures; forming one or more contact openings to the substrate and/or the one or more gate structures. In some embodiments, forming one or more contact openings to the substrate and/or the one or more gate structures comprises forming a butted contact opening and a self-aligned source/drain contact.

In yet another embodiment, a method for fabricating an integrated circuit comprises providing a substrate; forming one or more gate structures comprising a conductive layer and one or more gate structures comprising a dummy gate layer over the substrate; selectively etching back the conductive layer of the one or more gate structures and the dummy gate layer of the one or more gate structures; forming a protective layer over the etched back conductive layer of the one or more gate structures and the etched back dummy gate layer of the one or more gate structures; removing the protective layer from a portion of the one or more gate structures comprising the etched back conductive layer and a portion of the one or more gate structures comprising the etched back dummy gate layer; and forming one or more contact openings to the substrate and/or the one or more gate structures. In some embodiment, forming one or more contact openings to the substrate and/or the one or more gate structures comprises forming a poly contact, a butted contact, and a self-aligned source/drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, the method comprising:
providing a substrate;
forming a plurality of gate structures over the substrate, wherein each of the plurality of gate structures includes a gate layer;
selectively etching back the gate layer of at least one of the plurality of gate structures;
forming a protective layer over the etched back gate layer of the at least one of the plurality of gate structures;
simultaneously forming contact openings to the substrate and at least one of the plurality of gate structures, wherein the contact openings expose a portion of the substrate adjacent to at least one of the plurality of gate structures and a gate layer of at least one of the plurality of gate structures.

2. The method of claim 1 wherein the simultaneously forming the contact openings to the substrate and at least one of the plurality of gate structures comprises forming a butted contact opening and a self-aligned contact opening.

3. The method of claim 1 wherein:
the selectively etching back the gate layer of the at least one of the plurality of gate structures includes selectively etching back the gate layer of a first, second, and third gate layer of a first, second, and third gate structure, respectively; and
the forming the protective layer over the etched back gate layer of the at least one of the plurality of gate structures includes forming the protective layer over the etched back first, second, and third gate layer.

4. The method of claim 3 further comprising:
removing the protective layer from the first and second gate structures before forming the contact openings; and
wherein the forming the contact openings includes forming a first contact opening to the first gate structure, forming a second contact opening to the second gate structure, and forming a third contact opening to the third gate structure.

5. The method of claim 4 wherein the forming the first contact opening includes forming a poly contact opening, forming the second contacted opening includes forming a butted contact opening, and forming the third contact opening includes forming a self-aligned contact opening.

6. A method comprising:
providing a substrate having a first region and a second region;
forming a first gate structure disposed over the substrate in the first region and a second gate structure disposed over the substrate in the second region, wherein the first and second gate structures include a gate layer;
selectively etching back the gate layer of the second gate structure in the second region;
forming a protective layer over the etched back gate layer of the second gate structure in the second region; and
simultaneously forming a contact opening to each of the first and second gate structures, wherein the contact opening to the first gate structure exposes the gate layer of the first gate structure and the contact opening to the second gate structure exposes a portion of the substrate adjacent to the second gate structure.

7. The method of claim 6 wherein the forming the first and second gate structures including a gate layer includes:
forming the first gate structure and the second gate structure including a dummy gate layer;
removing the dummy gate layer from the first and second gate structures in the first and second regions to form trenches in the first and second gate structures; and
filling the trenches in the first and second gate structures with a conductive layer.

8. The method of claim 7 further comprising forming a first dielectric layer over the substrate, such that the first and second gate structures are disposed within the first dielectric layer.

9. The method of claim 8 wherein the selectively etching back the gate layer of the second gate structure includes selectively etching back the conductive layer of the second gate structure, and further comprising:
- performing a chemical mechanical polishing (CMP) process after filling the trenches in the first and second gate structures; and
- performing a CMP process after forming the protective layer over the etched back conductive layer of the second gate structure in the second region.

10. The method of claim 9 wherein each of the CMP processes stops at the first dielectric layer.

11. The method of claim 8 wherein the forming the contact openings to the first and second gate structures comprises:
- forming a second dielectric layer over the first dielectric layer; and
- performing a patterning and/or etching process on the first dielectric layer and the second dielectric layer.

12. The method of claim 6 wherein the simultaneously forming the contact openings to the first and second gate structures comprises:
- forming a butted contact opening in the first region; and
- forming a self-aligned contact opening in the second region.

13. The method of claim 6 further comprising:
- selectively etching back the gate layer of the first gate structure in the first region; and
- forming the protective layer over the etched back gate layer of the first gate structure in the first region.

14. The method of claim 13 further comprising:
- removing the protective layer over the etched back gate layer of the first gate structure in the first region before forming the contact openings to each of the first and second gate structures.

15. The method of claim 14 wherein the removing the protective layer over the etched back gate layer of the first gate structure in the first region comprises:
- forming a patterning layer over the substrate;
- etching the patterning layer to expose the protective layer of the first gate structure in the first region;
- selectively etching the protective layer of the first gate structure in the first region.

16. The method of claim 15 further comprising removing the patterning layer over the substrate.

17. The method of claim 15 further comprising forming an antireflective layer over the substrate.

18. The method of claim 13 further comprising:
- performing a CMP process after forming the protective layer over the etched back gate layers of the first and second gate structures in the first and second regions, respectively.

19. The method of claim 14 wherein the forming the contact openings to each of the first and second gate structures comprises:
- forming a dielectric layer over the semiconductor substrate; and
- performing a patterning and/or etching process on the dielectric layer.

20. A method comprising:
- providing a substrate having a first region and a second region;
- forming a first gate structure disposed over the substrate in the first region and a second gate structure disposed over the substrate in the second region, wherein the first and second gate structures include a gate layer;
- selectively etching back the gate layer of the second gate structure in the second region;
- forming a protective layer over the etched back gate layer of the second gate structure in the second region;
- simultaneously forming a contact opening to each of the first and second gate structures, wherein the contact opening to the first gate structure exposes the gate layer of the first gate structure and the contact opening to the second gate structure exposes a portion of the substrate adjacent to the second gate structure; and
- filling the contact opening to each of the first and second gate structures with a conductive material, thereby forming a contact to the exposed gate layer of the first gate structure and a contact to the exposed portion of the substrate adjacent to the second gate structure.

* * * * *